(12) United States Patent
Bryant et al.

(10) Patent No.: US 7,666,798 B2
(45) Date of Patent: Feb. 23, 2010

(54) METHOD OF MAKING A MICRO-FLUIDIC STRUCTURE

(75) Inventors: Frank Bryant, Denton, TX (US); Murray Robinson, Corinth, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 386 days.

(21) Appl. No.: 11/440,643

(22) Filed: May 24, 2006

(65) Prior Publication Data

US 2007/0273728 A1 Nov. 29, 2007

(51) Int. Cl.
*H01L 21/465* (2006.01)
(52) U.S. Cl. ............... 438/745; 257/414; 257/E21.215
(58) Field of Classification Search ................ 438/745; 257/414, E21.215
See application file for complete search history.

(56) References Cited

U.S. PATENT DOCUMENTS 6,936,494 B2 * 8/2005 Cheung ....................... 438/55
2002/0072243 A1 * 6/2002 Craighead et al. ........... 438/745
2003/0183916 A1 * 10/2003 Heck et al. ................... 257/684
2004/0110322 A1 * 6/2004 Hougham et al. ........... 438/119
2005/0048688 A1 * 3/2005 Patel et al. .................... 438/53
2007/0023851 A1 * 2/2007 Hartzell et al. .............. 257/414

* cited by examiner

*Primary Examiner*—Steven J Fulk
(74) *Attorney, Agent, or Firm*—David V. Carlson; Lisa K. Jorgenson

(57) ABSTRACT

A microfabricated structure and method of making that includes forming a first layer of material on a substrate, forming patterned sacrificial material having a predetermined shape on the first layer of material, and forming a second layer of material over the first layer and the patterned sacrificial material, which is then removed to form an encapsulated cavity. Ideally, the first and second layers are formed of the same type material. A structural support layer can be added to the second layer. Openings can be formed in the cavity, and the cavities can be layered side by side, vertically stacked with interconnections via the openings, and a combination of both can be used to construct stacked arrays with interconnections throughout.

14 Claims, 11 Drawing Sheets

METHOD OF MAKING A MICRO-FLUIDIC STRUCTURE

BACKGROUND OF THE INVENTION

1. Field of the Invention

The present invention pertains to microfabricated structures and, more particularly, to the formation of above-substrate micro-fluidic structures, such as cavities, enclosed chambers, and channels, preferably utilizing a single-type material.

2. Description of the Related Art

Micro-ElectroMechanical Systems (MEMS) refers to the fabrication and utilization of microscopic mechanical elements, such as sensors, actuators, and electronics, typically fabricated on or in silicon chips or a silicon substrate using microfabrication technology. This technology is borrowed from fabrication techniques used to form integrated circuits (e.g., CMOS, bipolar, or BICMOS processes). MEMS devices are generally mechanical components ranging in size from a micrometer (a millionth of a meter) to a millimeter (a thousandth of a meter), and can include three-dimensional lithographic features employing various geometries.

Typical applications for MEMS devices and systems include piezoelectrics for printers or bubble ejection of ink, accelerometers to control the deployment of airbags, gyroscopes for dynamic stability control, pressure sensors used in transportation and medical applications, such as car tire pressure sensors and disposable blood pressure sensors, micromirrors used to form displays, optical switching technology for data communications, and heated chambers for fluidic applications.

A related technology is Nano-ElectroMechanical Systems (NEMS), which are similar to MEMS but on a smaller scale, including displacements and forces at the molecular and atomic scales. Together NEMS and nanotechnology have made it possible to provide mechanical and electrical devices on a single chip that are much smaller, more functional and reliable, and produced at a fraction of the cost of conventional macroscale elements. In many of these applications, chambers and channels are used for transporting, storing, manipulating, and sensing fluids both in gaseous and liquid form. The formation of these chambers and channels in MEMS devices presents unique fabrication challenges.

Today, most fluidic chambers and channels in MEMS applications are constructed from thick deposited materials in which the chamber or channel is formed by either patterning and etching or by formation in the substrate materials, such as the silicone substrate used to form integrated electronic circuits.

One of the basic building blocks in MEMS microfabrication is the use of thin-film deposition processes on a substrate, applying a patterned mask on top of the deposited film by photolithographic imaging, and etching the film utilizing a selective mask process.

Typical materials used are organic polymers, silicon, or various glass-like films. Generally, the bottom, sides, and top surrounding the channels are formed of three different material types for ease of construction. Using fewer types of material increases the difficulty of fabrication. Of the many available materials, the easiest to build with, organic polymers, have dimension control limitations because of the large shrinkage factor during curing (typically 25%). If not fully cured, they have poor adhesion characteristics and are not as resistant to the stresses of temperature and chemicals. While other materials are available with more desirable characteristics, they are impractical because of the thickness required. In some cases, tens of microns of vertical dimension are necessary in order to fabricate a fluidic chamber or channel.

FIG. 1 illustrates one type of conventional chamber structure 20 formed on a substrate 22. In this example, an optional integrated circuit 24 is formed on top of the substrate. A lower portion 26 of the chamber 28 is formed of a thin deposited film, while the chamber sidewalls 30 are typically a thick organic "spin-on" material, such as polyimide, SU8 and Fox. The top 32 of the chamber can be a rigid plate applied after the channel is formed or a deposited material applied before the channel is formed. The disadvantage of this construction is, as alluded to above, the use of three separate materials, the thin film for the lower portion 26, the spin-on material for the sidewalls 30, and the rigid material for the top plate 32. In addition to the aforementioned problems caused by the different materials, different processes are required, increasing the complexity and cost of this structure.

FIG. 2 shows another approach to forming a channel or a chamber structure 34 in which the substrate 36 is etched or otherwise excavated to form the channel 38 that is then enclosed by a subsequent layer 40. In this case, only two materials are used, but the disadvantage remains of using materials having potentially conflicting properties as well as the necessity of using different processes.

BRIEF SUMMARY OF THE INVENTION

The disclosed embodiments of the present invention are directed to a microfabricated structure and method of making same. It is to be understood that while the present invention will be described in the context of MEMS microfabrication techniques and applications, the present invention will have application to NEMS techniques and applications as well as to other related technologies. Thus, while representative embodiments of the invention are described in the context of MEMS technologies, the techniques can be more broadly applied.

In accordance with one embodiment of the invention, a method of forming a cavity is provided, the method including forming a first layer of a first type of material on a substrate; forming patterned sacrificial material on the first layer of material; forming a second layer of material on the first layer of material, preferably formed of the first type of material, and over the patterned sacrificial material to encapsulate the patterned sacrificial material within the first and second layers of material; and removing the patterned sacrificial material to form the cavity enclosed within the first and second layers of material.

In accordance with another aspect of the foregoing embodiment, the cavity of the structure has a configuration that is in the shape of the removed patterned sacrificial material. In addition, a structural support layer can be formed on the second layer that is at least adjacent to sides of the cavity.

In accordance with another embodiment of the invention, a method of forming a structure is provided, the method including forming a microstructure, comprising: forming a first layer of a first type of material on a substrate; forming patterned sacrificial material on the first layer; forming a second layer of material on the first layer of material and over the patterned sacrificial material to encapsulate the patterned sacrificial material within the first and second layers of material; and removing the patterned sacrificial material to form a microstructure having an enclosed cavity.

In accordance with another aspect of the foregoing embodiment, the second layer is preferably of the same type of material as the first layer, and the cavity has a configuration that is in the shape of the patterned sacrificial material removed from between the first and second layers.

In accordance with another aspect of the foregoing embodiment, a structural support layer is formed on the second layer that is at least adjacent sides of the cavity to provide support for additional layers of material. This structural support layer can be formed of the same type of material as the second layer or it may be formed of other material that is compatible with the second layer of material for its purposes.

In accordance with a further aspect of the foregoing embodiment, an opening is formed in the second layer that is in fluid communication with the cavity, and an opening is formed in the substrate and the first layer that is in fluid communication with the cavity. In one embodiment, the cavity is in the shape of a conduit having open ends to conduct fluid therethrough.

In accordance with another embodiment of the invention, an integrated circuit is formed on the substrate between the first layer and the substrate to form a microstructure. This microstructure, which includes the openings described above, can be used to form a stacked composite structure by stacking the microstructures on top of each other. Ideally, at least one microstructure is in fluid communication with at least one other adjacent microstructure.

In accordance with another aspect of the foregoing embodiment, the microstructures can be placed side by side to form a layer of microstructures. When combined with the stacked composite structure, an array of microstructures is formed.

In accordance with another aspect of the foregoing embodiment, the structure can be formed without an integrated circuit between the substrate and the first layer, and a third layer of material is formed over the structural support layer and the second layer, and a fourth layer of material is formed over the third layer of material and over a patterned sacrificial material placed on the third layer, and the patterned sacrificial material between the third and fourth layers is removed to form an enclosed cavity structure between the third and fourth layers.

In accordance with another aspect of the foregoing embodiment, openings are formed in the third and fourth layers that are in fluid communication with the enclosed cavity between the third and fourth layers and that is also in fluid communication with the cavity formed between the first and second layers.

In accordance with another embodiment of the invention, a structure is provided, the structure including a first layer of material formed of a first type of material on a substrate; a second layer of material formed over the first layer of material, the second layer of material formed of the same type of material as the first layer of material, the second layer of material forming a cavity between the second layer of material and the first layer of material, the cavity having a configuration that is in the shape of a patterned sacrificial material removed from between the second layer of material and the first layer of material.

BRIEF DESCRIPTION OF THE SEVERAL VIEWS OF THE DRAWING(S)

The foregoing and other features and advantages of the present invention will be more readily appreciated as the same become better understood from the following detailed description when taken in conjunction with the accompanying drawings, wherein.

DETAILED DESCRIPTION OF THE INVENTION

Figure 1:
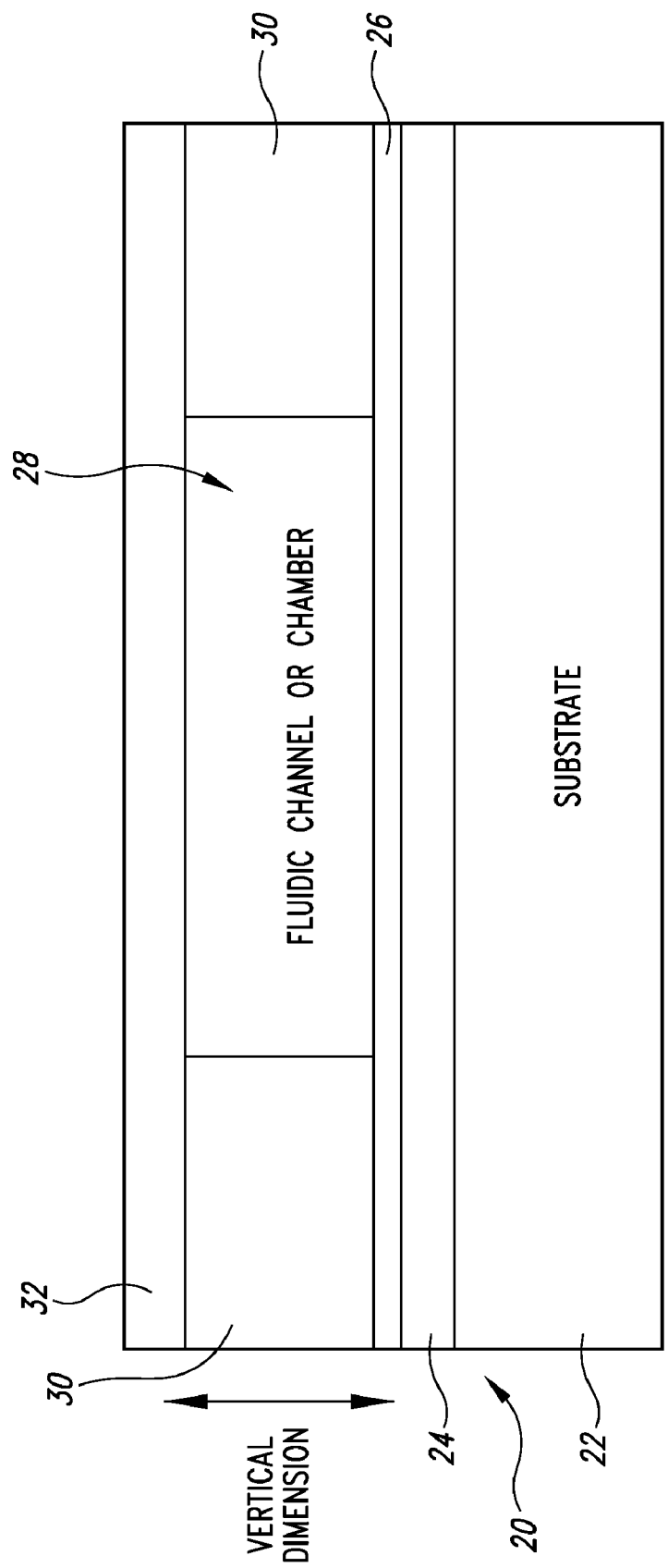
FIG. 1 illustrates in cross-section a conventional fluidic channel or chamber structures.
Figure 2:
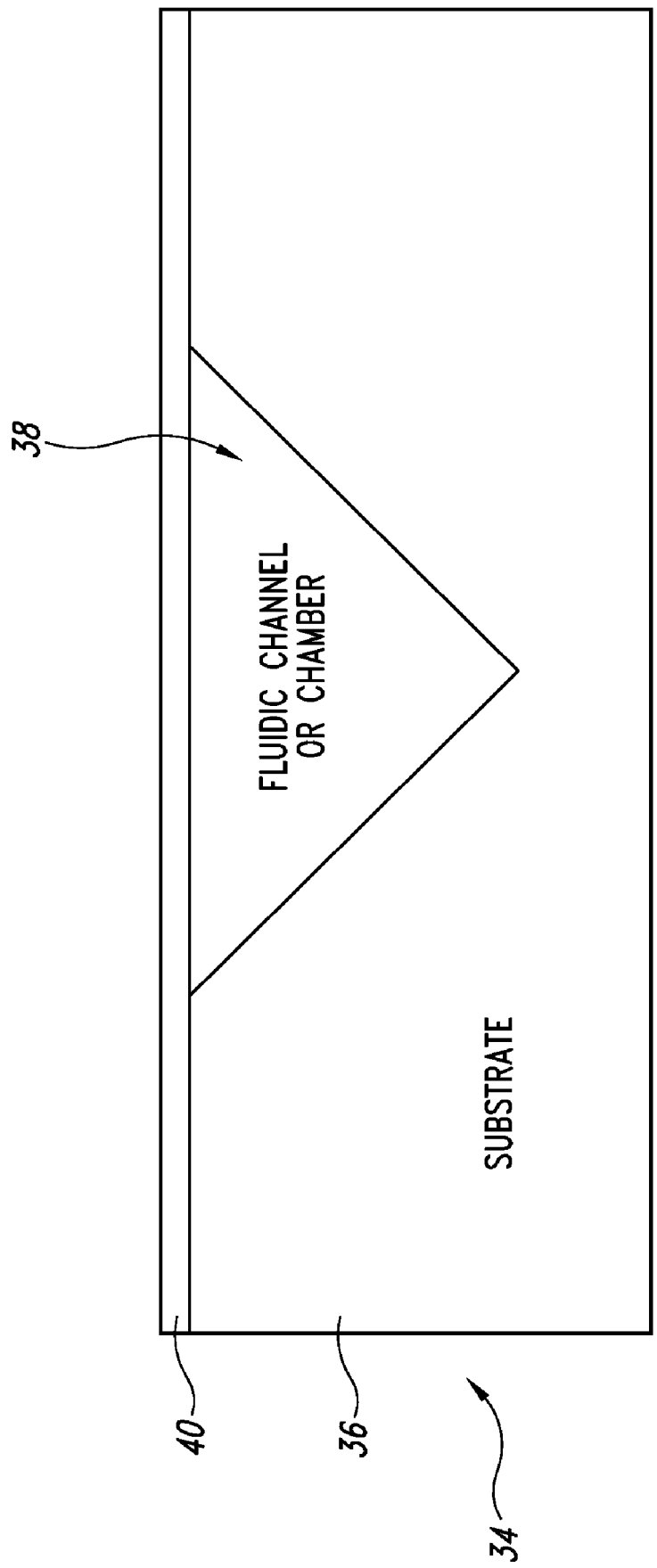
FIG. 2 illustrates in cross-section an alternative approach to forming a conventional channel within a substrate.
Figure 3:
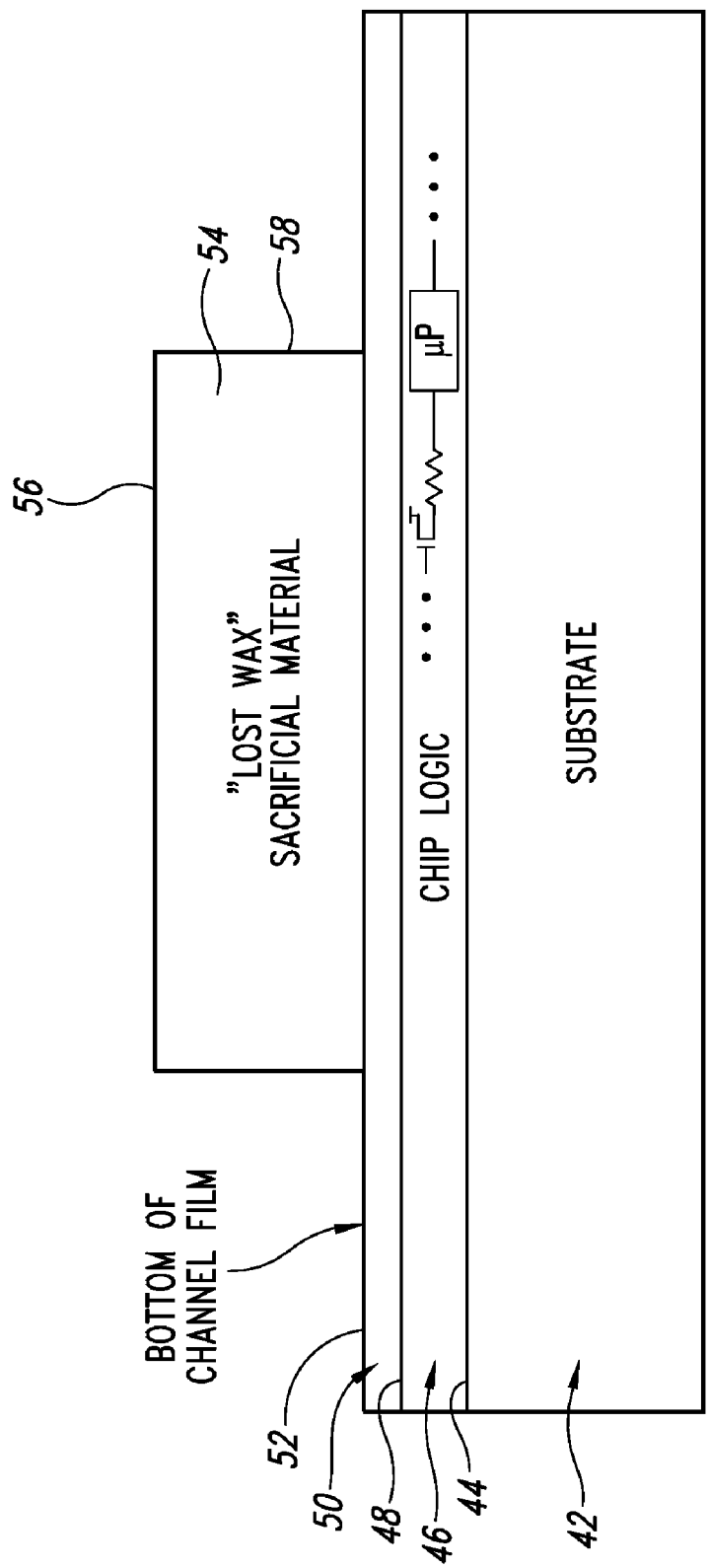
FIGS. 3-5 illustrate the steps of the method in accordance with one embodiment of the invention for forming a microfluidic structure.
Figure 4:
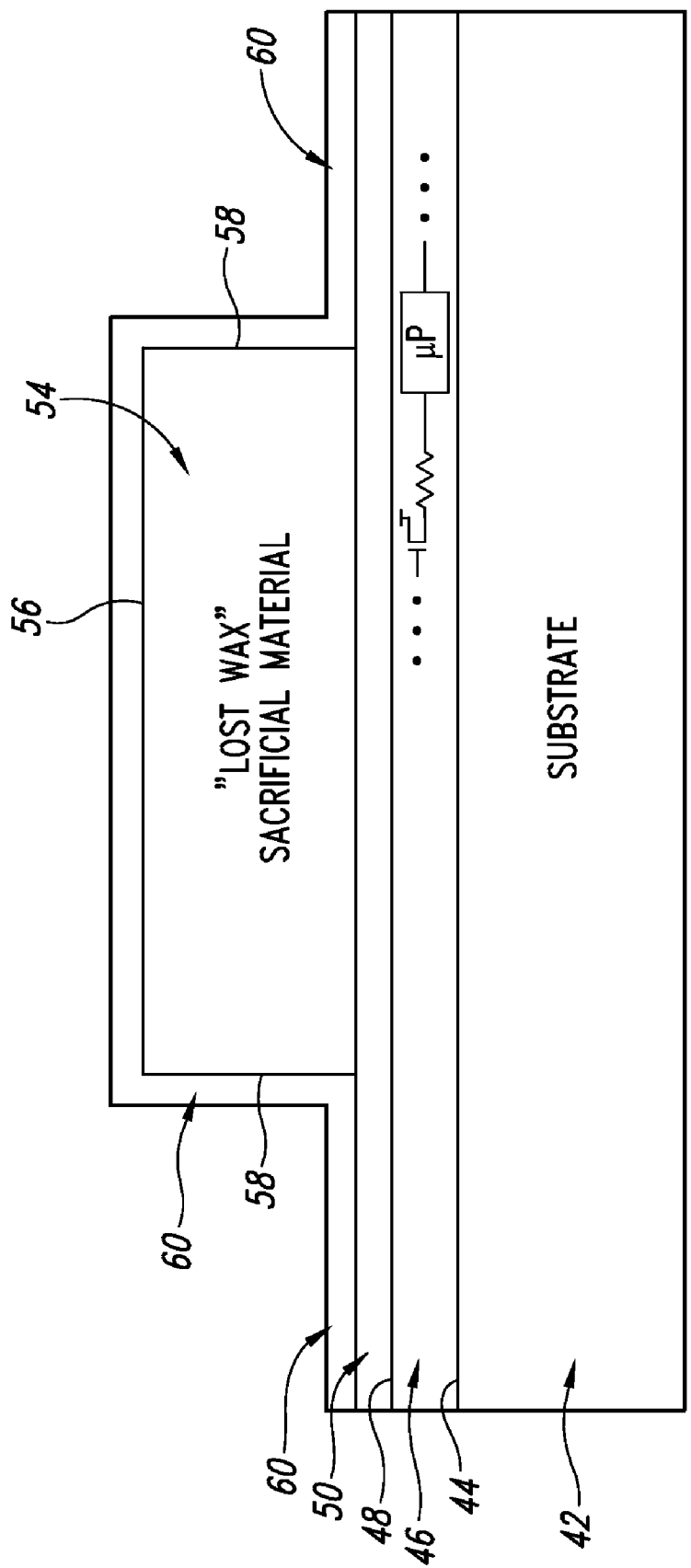
Figure 5:
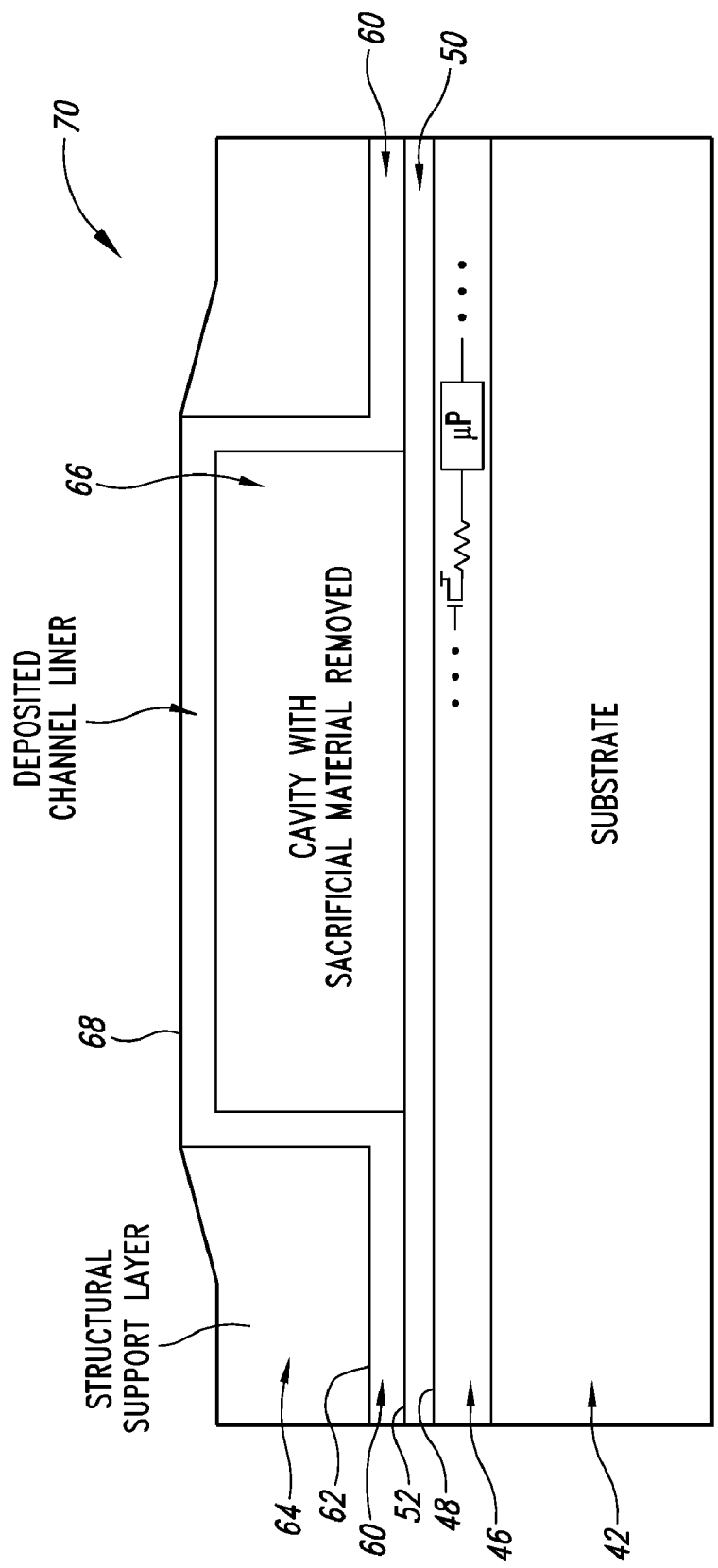

Referring next to FIGS. 3-5, illustrated therein is one embodiment of the invention that shows the steps of a method for forming a cavity. A substrate 42 is provided, preferably formed of silicon or other typical material used in forming microstructures or nanostructures. The substrate 42 has a first surface, in this case a top surface 44 on which is formed an optional layer of chip logic 46. It is to be understood that this chip logic can be formed on top of the substrate 42, or on top of and within the substrate 42, or solely within the substrate, as is well known. It is also to be understood that the chip logic layer 46 is optional and is not necessary to practice this embodiment of the invention. The chip logic layer 46 has a top surface 48 as shown in the side view of FIG. 3 on which is formed a first layer 50 of a first type of material. This first layer of material 50 will become the bottom of a cavity to be formed. In one aspect of this embodiment, the first layer of material 50 can be a film formed of metals, metal oxides, oxides, nitrides, deposited silicon films, oxynitrides, silicon-carbide, or an array of many materials. It can be deposited using one of many methods known to those skilled in the art, including chemical vapor deposition, electrodeposition, epitaxy, thermal oxidation, physical vapor deposition, and casting, among other methods.

The first layer 50 has an exposed surface 52 on which is formed patterned sacrificial material 54 of a selected shape. Ideally, the selected shape of the patterned sacrificial material 54 is the spatial opposite of a final cavity to be formed. This material 54 is ideally formed of "lost wax," however other known sacrificial material can be used under appropriate conditions. The materials 54 has an exposed top surface 56 and sidewalls 58 that are substantially orthogonal to the exposed surface 52 of the first layer 50 and to the top surface 56.

Referring next to FIG. 4, shown here is a subsequent step in which a second layer of material 60 is formed over the first layer of material 50 and over the patterned sacrificial material 54 to cover the top surface 56 and sidewalls 58 of the patterned sacrificial material 54 such that it is enclosed between the first layer 50 and the second layer 60. Ideally, the second layer 60 functions as a liner for the subsequent chamber, channel, or cavity to be formed, and the second layer 60 is formed of the same type of material as the first layer 50 and, hence, the same process used to deposit or form the first layer 50 can be used here. At this point, the patterned sacrificial material 54 can be removed or a structural support layer 64 can be formed over a top surface 62 of the second layer 60 that extends to at least the portions of the second layer 60 that cover the sides 58 of the patterned sacrificial material 54. In a preferred embodiment, the patterned sacrificial material 54 is first removed and then the structural support layer 64 is added. The structural support layer 64 is preferably applied or formed by conventional methods on top of the second layer 60 and extends up to the level of the top of the second layer on the top side of the cavity 66.

Figure 6:
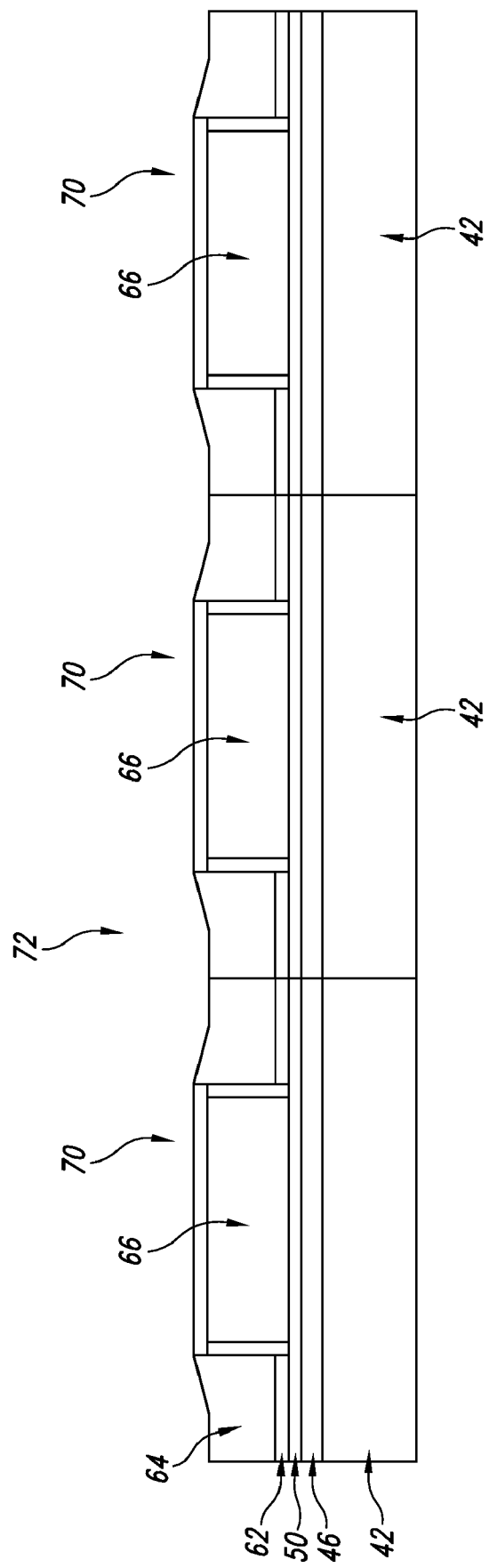
FIG. 6 illustrates one alternative embodiment of a microfluidic structure formed in accordance with the present invention.

With the removal of the sacrificial material 54, a cavity 66 is thus formed between the first and second layers 50, 60 and can remain completely enclosed as shown in FIG. 5. The structure 70 shown in FIG. 5 has the exposed surface 68 of the second layer 60 as the top surface of the structure 70. The particular structure 70 can be placed side by side with other structures 70, as shown in FIG. 6, to form a layered microfabricated structure 72 having multiple cavities 66. Alternatively, the layered microfabricated structure 72 can be formed on a unified substrate 42 or on separate substrates that are then placed together. Hence, the layered structure 72 can be formed of segments of microfabricated structure 70 or as a single unitary structure in which the layers are deposited across the entire substrate 42.

Figure 7:
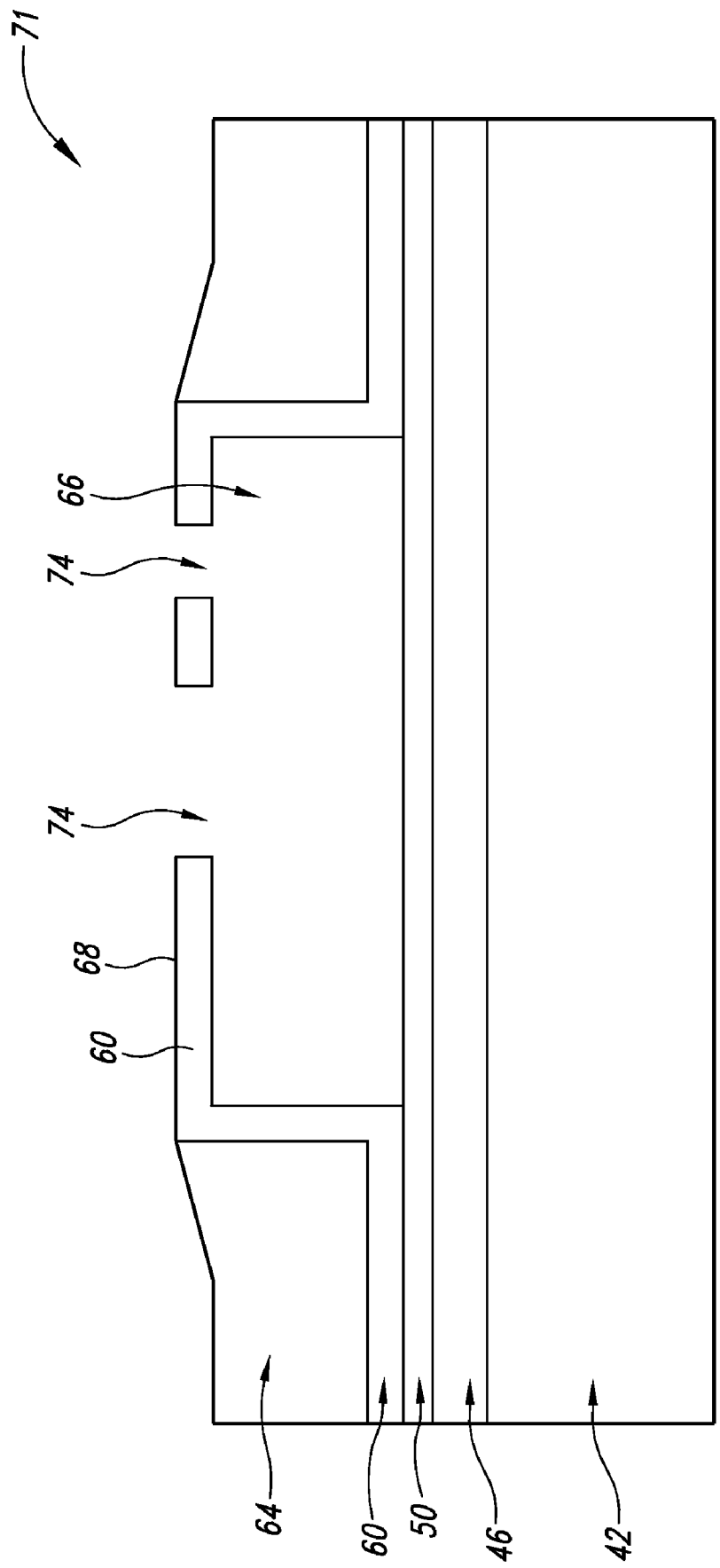
FIG. 7 illustrates another embodiment of a microstructure formed in accordance with the present invention.

FIG. 7 illustrates another embodiment of the invention in which the microfabricated structure 70 has an opening 74 formed in the exposed surface 68 and through the second layer 60 to be in fluid communication with the cavity 66. In one embodiment, the cavity 66 can be formed as an elongate conduit having at least one and preferably two or more openings 74 to enable fluid, such as a gas or a liquid, to be conducted through the cavity 66. Microvalving may be used to control fluid flow into and out of the cavity.

Figure 8:
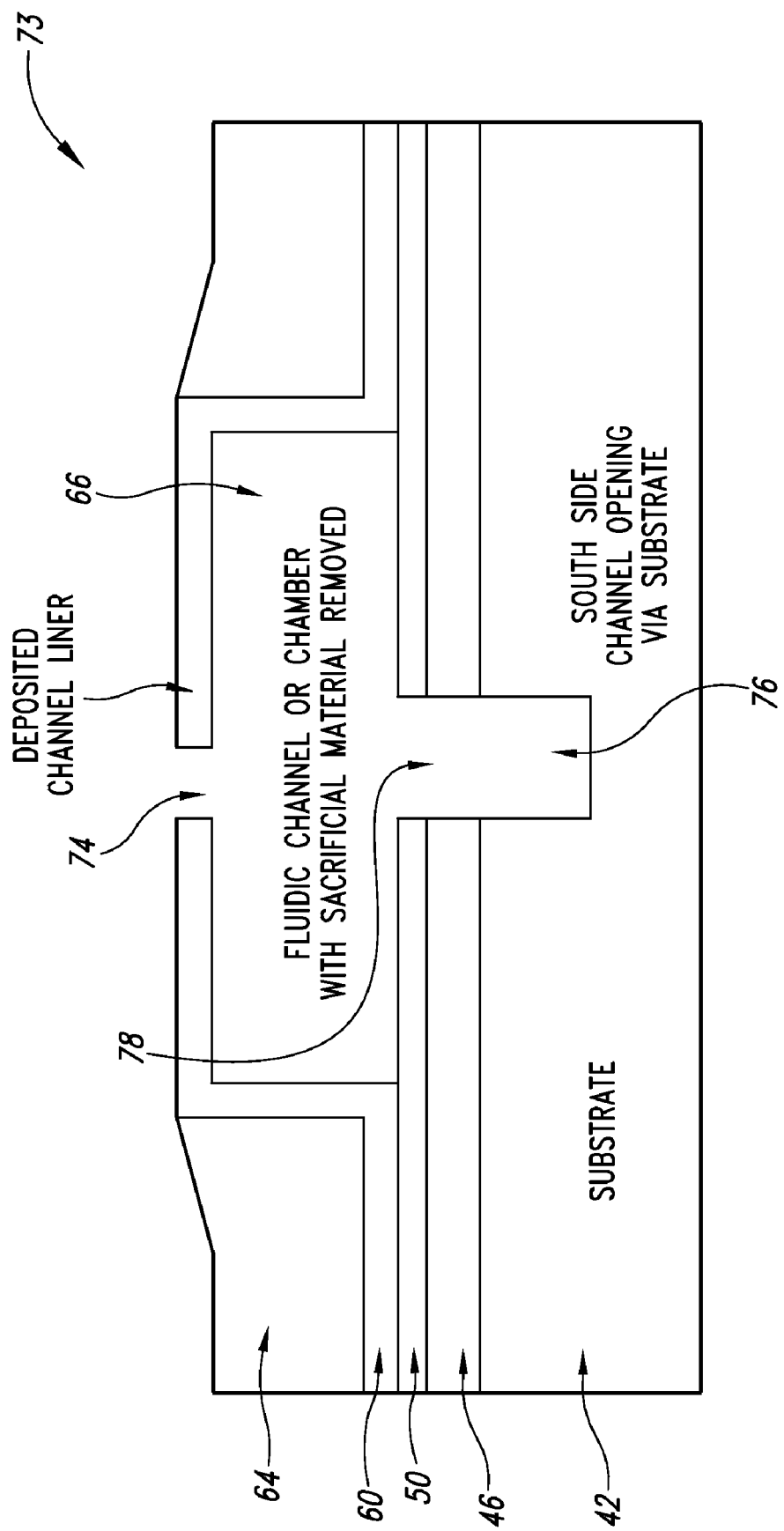
FIG. 8 illustrates a further embodiment of a microstructure formed in accordance with the present invention.
Figure 9:
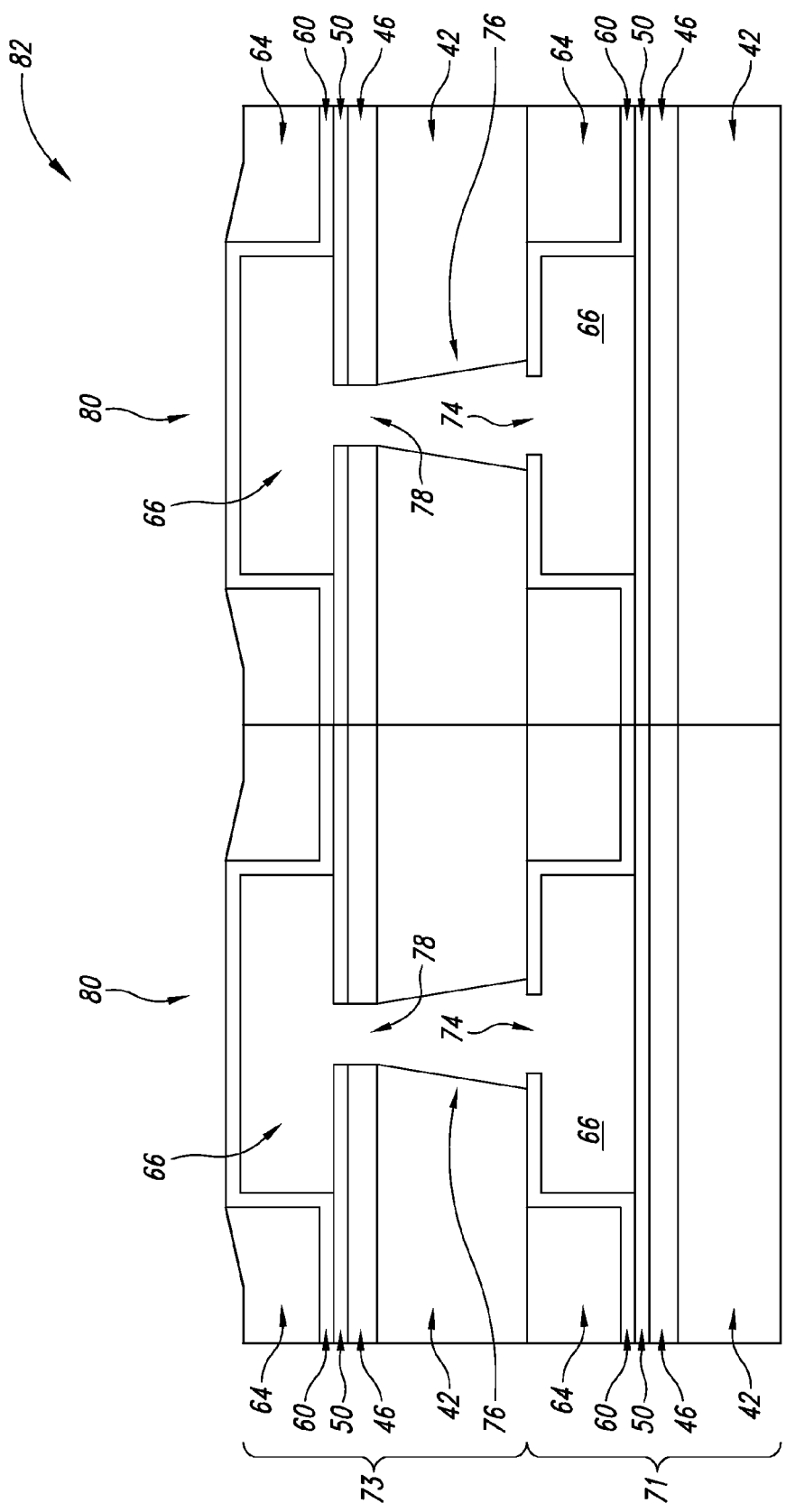
FIG. 9 illustrates stacked wafers and arrayed structures formed in accordance with the present invention.

FIG. 8 illustrates yet another embodiment of the invention in which a channel 76 is formed in the substrate and a subsequent opening 78 is formed through the chip logic layer 46 and the first layer 50 to be in fluid communication with the cavity 66. A combination of the embodiments shown in FIGS. 7 and 8 may also be formed, which is shown in FIG. 9. Here, a stacked composite structure 80 is constructed from a combination of the microfabricated structures 71 and 73 in which the microfabricated structure 73 having the triangular-shaped channel 76 formed in the substrate 42 is placed over the microfabricated structure 71 to be in fluid communication with the opening 74 and the cavity 66 thereof. This stacked composite structure 80 can be placed side by side with another stacked composite structure 80 to form an array structure 82.

Figure 10:
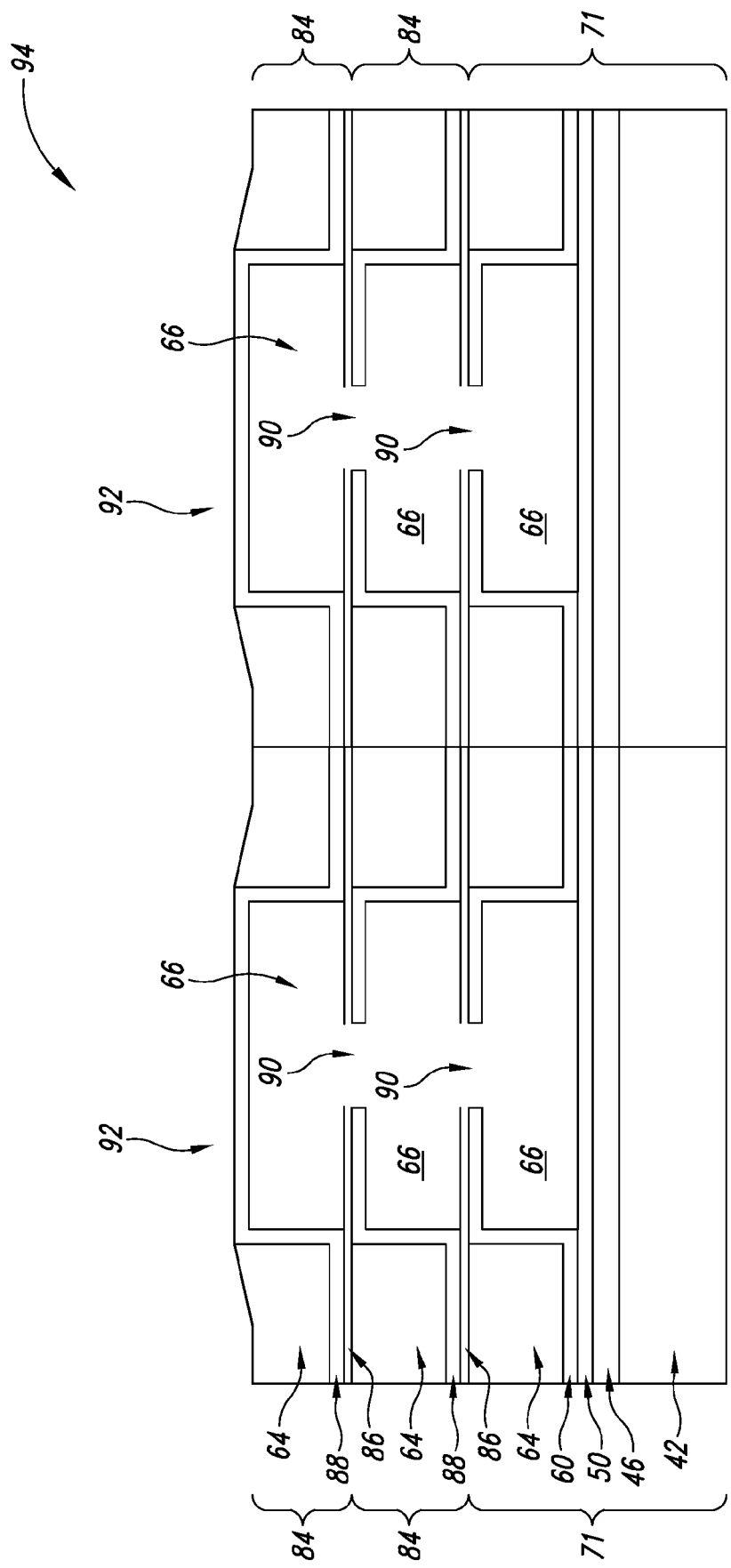
FIG. 10 illustrates stacked structures and arrays formed in accordance with the present invention.

Referring next to FIG. 10, shown therein is still yet another embodiment of the invention in which the structure 71 from FIG. 7 having the opening 74 in the top surface 68 has additional layers 84 of cavities 66 formed thereon. More particularly, a third layer of material 86 is formed over the second layer of material 60 and the structural support layer 64, after which patterned sacrificial material is placed over the third layer as described above with respect to FIGS. 3-5. A fourth layer 88 of material is formed over the third layer 86 and the patterned sacrificial material, and the patterned sacrificial material is then removed to form the cavity 66, as described above with respect to FIGS. 3-5. Ideally the first, second, third, and fourth layers are all formed of the same type material. Each cavity layer 84 has openings 90 formed therein through the third layer 86 and the fourth layer 88 to enable fluid communication between the layers of cavities 66. Here, this stacked cavity structure 92 can be placed adjacent another stacked array structure 92 to form a composite array structure 94.

Thus, the embodiments shown in FIGS. 7 and 8 show possible openings into the cavity 66 for fluid inlet and/or outlet, visual inspections, fluid pressure control, or any of several applications. The cavities 66 may be stacked in vertical orientation with interconnections via the openings 74, 76, 78, and 90 in any location. With the various arrays as illustrated in FIGS. 9 and 10, a honeycomb effect can be achieved with interconnections throughout.

Figure 11:
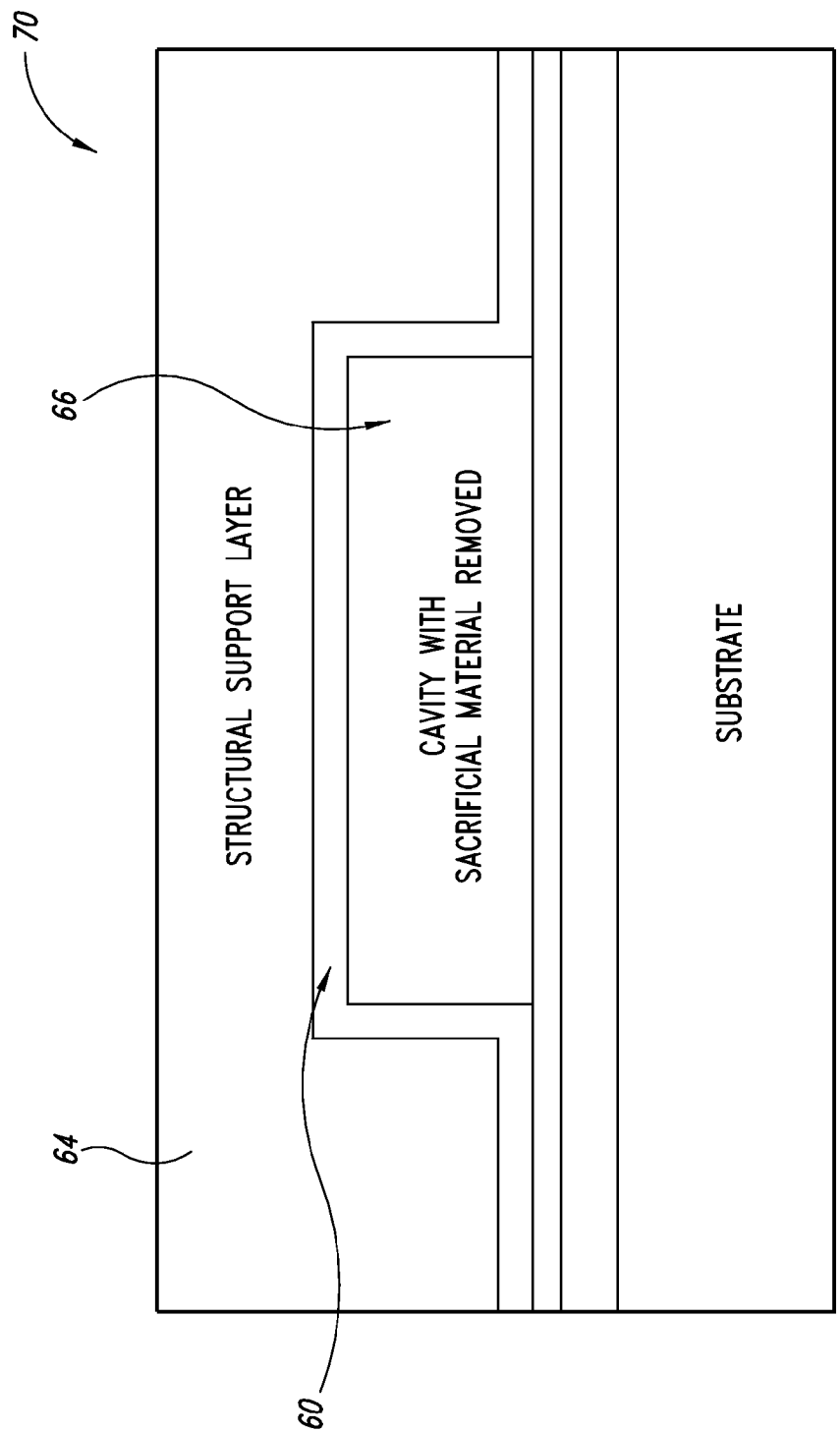
FIG. 11 illustrates an alternative embodiment of a structure formed in accordance with the present invention.

While preferred embodiments of the invention have been illustrated and described, it is to be understood that various changes can be made therein without departing from the spirit and scope of the invention. For example, FIG. 11 shows the structure 70 from FIG. 5 having the structural support layer 64 extending further above the cavity 66 and the second layer 60. This provides additional topside support for the cavity 66, especially when additional structures are to be stacked, formed, or deposited thereon. Hence, the invention is to be limited only by the accompanying claims and the equivalents thereof.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method of forming a cavity on a substrate, comprising:
   forming a first layer of a first type of material on a substrate;
   forming patterned sacrificial material on the first layer of material, the patterned sacrificial material formed to have sidewalls and a top surface;
   forming a second layer of the first type of material on the first layer of material and over the patterned sacrificial material to encapsulate the patterned sacrificial material within the first and second layers of material;
   removing the patterned sacrificial material to form the cavity enclosed within the first and second layers of material; and
   adding structural support material on the second layer of material that abuts the second layer adjacent the sidewalls of the patterned sacrificial material and extending only to a level of a ton of the second layer on a top side of the cavity.

2. The method of claim 1, further comprising forming an opening in the second layer of material that is in communication with the cavity.

3. The method of claim 1, further comprising forming openings in the second layer of material that are in fluid communication with the cavity to enable movement of a fluidic substance into and out of the cavity.

4. A method of forming a structure, comprising:
   forming a first microstructure, comprising:
      forming a first layer of a first type of material on a substrate;
      forming patterned sacrificial material on the first layer to have sides and a top surface;
      forming a second layer of material on the first layer of material and over the patterned sacrificial material to encapsulate the patterned sacrificial material within the first and second layers of material;
      forming a layer of structural support material on the second layer adjacent the sides of the patterned sacrificial material and extending to a level of a top of the second layer on the top surface of the patterned sacrificial layer; and removing the patterned sacrificial material to form a microstructure with an enclosed cavity.

5. The method of claim 4 wherein the second layer comprises material of the same type as the first layer.

6. The method of claim 5 wherein the cavity has an internal configuration in the shape of the patterned sacrificial material.

7. The method of claim 6 wherein the structural support material extends above the top of the second layer on the top surface of the patterned sacrificial layer to form a substantially planar support surface.

8. The method of claim 7, comprising forming a second microstructure on top of the first microstructure that is supported by the substantially planar support surface.

9. The method of claim 5, further comprising, before the step of forming a microstructure, forming an integrated circuit in association with the substrate and over which the first layer of material is formed.

10. The method of claim 5, further comprising forming the cavity with openings to enable fluid to flow into and out of the cavity.

11. The method of claim 5, further comprising forming a plurality of microstructures in a side-by-side relationship.

12. The method of claim 5, further comprising forming an opening in the second layer that is in fluid communication with the cavity, and forming an opening in the substrate and the first layer that is in communication with the cavity.

13. The method of claim 12, further comprising forming a stacked composite structure by stacking the microstructures.

14. The method of claim 13 wherein each microstructure in the stacked composite structure is in fluid communication with at least one other adjacent microstructure.

* * * * *

UNITED STATES PATENT AND TRADEMARK OFFICE
CERTIFICATE OF CORRECTION

| | | |
|---|---|---|
| PATENT NO. | : 7,666,798 B2 | |
| APPLICATION NO. | : 11/440643 | |
| DATED | : February 23, 2010 | |
| INVENTOR(S) | : Frank Bryant et al. | |

It is certified that error appears in the above-identified patent and that said Letters Patent is hereby corrected as shown below:

<u>Column 6, Line 46:</u>
"only to a level of a ton of the second layer on a top side" should read, --only to a level of a top of the second layer on a top side--.

Signed and Sealed this

Twentieth Day of September, 2011

David J. Kappos
*Director of the United States Patent and Trademark Office*